United States Patent
Wang et al.

(10) Patent No.: US 6,383,954 B1
(45) Date of Patent: May 7, 2002

(54) PROCESS GAS DISTRIBUTION FOR FORMING STABLE FLUORINE-DOPED SILICATE GLASS AND OTHER FILMS

(75) Inventors: Yaxin Wang, Fremont; Diana Chan, San Jose; Turgut Sahin, Cupertino; Tetsuya Ishikawa, Santa Clara; Farhad Moghadam, Los Gatos, all of CA (US)

(73) Assignee: Applied Materials, Inc., Santa Clara, CA (US)

( * ) Notice: Subject to any disclaimer, the term of this patent is extended or adjusted under 35 U.S.C. 154(b) by 0 days.

(21) Appl. No.: 09/361,682

(22) Filed: Jul. 27, 1999

(51) Int. Cl.$^7$ ................................................ H01L 21/31
(52) U.S. Cl. ......................... 438/789; 438/787; 438/788
(58) Field of Search ................................. 438/787, 788, 438/789, 790, 800

(56) References Cited

U.S. PATENT DOCUMENTS

| | | | |
|---|---|---|---|
| 4,062,318 A | * 12/1977 | Ban et al. ...................... | 118/49 |
| 4,719,873 A | 1/1988 | Fujiyama .................... | 118/723 |
| 4,913,929 A | 4/1990 | Moslehi et al. ............... | 427/39 |
| 5,105,761 A | 4/1992 | Charlet et al. ............... | 118/723 |
| 5,110,437 A | 5/1992 | Yamada et al. ......... | 204/298.33 |
| 5,269,847 A | 12/1993 | Anderson et al. ........... | 118/715 |
| 5,273,609 A | 12/1993 | Moslehi ....................... | 156/345 |
| 5,340,459 A | 8/1994 | Takehara ............... | 204/298.07 |
| 5,494,522 A | 2/1996 | Moriya et al. .............. | 118/719 |
| 5,500,256 A | 3/1996 | Watabe ....................... | 427/579 |
| 5,522,934 A | * 6/1996 | Suzuki et al. ........... | 118/723 R |
| 5,525,159 A | 6/1996 | Hama et al. .............. | 118/723 I |
| 5,545,436 A | 8/1996 | Saito ....................... | 427/255.3 |
| 5,622,606 A | 4/1997 | Kügler et al. .......... | 204/192.12 |
| 5,693,139 A | 12/1997 | Nishizawa et al. ........... | 117/89 |

FOREIGN PATENT DOCUMENTS

| | | |
|---|---|---|
| EP | 0 877 410 A1 | 11/1988 |
| EP | 0 877 410 | * 11/1998 |
| EP | 0 883 166 A2 | 12/1998 |
| JP | 0129362 | 11/1989 |
| WO | 99/00532 | 1/1999 |

OTHER PUBLICATIONS

Takamatsu, Akira, et al., "Plasma–Activated Deposition and Properties of Phosphosilicate Glass Film," *Journal of the Electrochemical Society* (1984) No. 8:1865–1870.

* cited by examiner

Primary Examiner—Alexander G. Ghyka
(74) Attorney, Agent, or Firm—Townsend & Townsend & Crew

(57) ABSTRACT

A substrate processing system includes a housing defining a chamber for forming a film on the substrate surface of a substrate disposed within the chamber. The system includes a first plurality of nozzles that extend into the chamber for injecting a first chemical at a first distance from a periphery of the substrate surface, and a second plurality of nozzles that extend into the chamber for injecting a second chemical at a second distance from the periphery of the substrate surface. The second distance is substantially equal to or smaller than the first distance. In one embodiment, the first chemical contains a dielectric material and the second chemical contains dopant species which react with the first chemical to deposit a doped dielectric material on the substrate. Injecting the dopant species closer to the substrate surface than previously done ensures that the dopant species are distributed substantially uniformly over the substrate surface and the deposition of a stable doped dielectric layer.

33 Claims, 8 Drawing Sheets

US 6,383,954 B1

PROCESS GAS DISTRIBUTION FOR FORMING STABLE FLUORINE-DOPED SILICATE GLASS AND OTHER FILMS

BACKGROUND OF THE INVENTION

The present invention relates to a method and apparatus for substrate processing. More particularly, the present invention relates to an apparatus and a method for improved process gas distribution forming a variety of films including fluorosilicate glass (FSG) films.

One of the primary steps in the fabrication of modern semiconductor devices is the formation of a thin film on a semiconductor substrate by chemical reaction of gases. Such a deposition process is referred to as chemical vapor deposition (CVD). Conventional thermal CVD processes supply reactive gases to the substrate surface where heat-induced chemical reactions can take place to produce the desired film. Plasma enhanced CVD processes promote the excitation and/or dissociation of the reactant gases by the application of radio frequency (RF) energy to the reaction zone proximate the substrate surface thereby creating a plasma of highly reactive species. The high reactivity of the released species makes the process condition window for deposition larger than in thermal processes.

In one design of plasma CVD chambers, a vacuum chamber is generally defined by a planar substrate support, acting as a cathode, along the bottom, a planar anode along the top, a relatively short sidewall extending upwardly from the bottom, and a dielectric dome connecting the sidewall with the top. Inductive coils are mounted about the dome and are connected to a source radio frequency (SRF) generator. The anode and the cathode are typically coupled to bias radio frequency (BRF) generators. Energy applied from the SRF generator to the inductive coils forms a plasma within the chamber. Such a chamber is referred to as a high density plasma CVD (HDP-CVD) chamber.

In some HDP-CVD chambers and in other types of chambers, it is typical to mount two or more sets of equally spaced gas distributors, such as nozzles, to the sidewall such that the nozzles extend into the region above the edge of the substrate support surface. The gas nozzles for each set are coupled to a common manifold for that set; the manifolds provide the gas nozzles with process gases.

In one substrate processing chamber of this type, the nozzles have different lengths depending on the type of gas injected into the chamber through the nozzle. For example in this chamber, in some undoped silicate glass (USG) deposition processes using a process gas including silane ($SiH_4$) and molecular oxygen ($O_2$), precise amounts of silane are injected into the chamber with large amounts of oxygen so that enough oxygen exists to react with all the silane. Because so much oxygen exists, and often fills the chamber, it is commonly believed that the oxygen nozzle lengths do not affect the USG process significantly. In fact, for such a process, some chambers do not use nozzles at all to introduce oxygen but instead leak the oxygen into the chamber through holes in the chamber wall or walls.

In another type of substrate deposition chamber, it has been proposed to include multiple gas injection nozzles with some nozzles being on different levels from (e.g., above or below) other nozzles. It has also been proposed in these chambers that nozzles on higher levels extend further into the deposition chamber to aid in deposition uniformity.

In both the above described chambers and in other chambers, some gases may be injected together through common nozzles. Typically, gases that are injected together through common nozzles include gases that are not likely to react, or that react slowly enough during the delivery, with each other. For example, in deposition of the USG layer referred to above it is common to mix an inert gas such as helium or argon with either oxygen or silane prior to introducing those gases into the chamber.

Halogen-doped silicon oxide layers, and fluorine-doped silicate glass (FSG) layers in particular, are becoming increasingly popular in a variety of applications due to the low dielectric constants achievable for these films which are lower than the dielectric constants of USG films and their excellent gap-fill properties, especially for high speed semiconductor devices with increasingly smaller features sizes. In the deposition of FSG layers, it is common to use $SiF_4$ as the fluorine source since $SiF_4$ provides both Si and F species for fluorine-doped silicon oxide (SiOF). Other suitable gases include $SiH_2F_2$ and $NF_3$. $SiF_4$ can be introduced in the chamber separately from the other source gases, such as $O_2$ and $SiH_4$, but it would increase the complexity and cost of the system by requiring separate gas distribution apparatus. The need for additional gas injection nozzles inside the chamber would render the chamber less robust and make it more difficult to obtain process repeatability. Thus, it is common to mix the fluorine source with other gases that are chemically comparable (e.g., with the oxygen source) prior to introducing the gases into the chamber.

The fluorine source can also be mixed with a separate silicon source gas (e.g., $SiH_4$, $SiCl_4$, $SiCH_6$, or $SiC_3H_{10}$) and injected from the same nozzle, but it will generate a relatively nonuniform film due to a more localized concentration of silicon source feeding. Fluorine is known to have a relatively long residence time. Thus, like oxygen, it is commonly believed that the length of the nozzle used to introduce a fluorine source into the chamber is not particularly important. It is commonly believed that the introduced fluorine will be distributed throughout the chamber because of its relatively long residence time.

Thus, for reasons discussed above, known deposition techniques currently used that employ separate silicon, oxygen and fluorine sources combine the fluorine source and oxygen source and flow the combination into the CVD chamber through relatively short nozzles while the separate silicon source (e.g., $SiH_4$) is introduced (flowed) through longer nozzles. FSG films deposited in such a manner have physical properties acceptable for many applications. For some applications, however, improved deposition techniques are desirable.

SUMMARY OF THE INVENTION

The present invention is directed toward an improved substrate processing chamber having an improved process gas delivery system. The improved system is particularly applicable to the deposition of FSG films using $SiF_4$ as a source of fluorine, but can also be used with many other processes. In part, the improvement is achieved by varying the length of the gas injection nozzles in a manner not previously known.

As described above, it was commonly thought that the length of the nozzles used to introduce a fluorine source into a substrate processing chamber for the formation of an FSG film was not particularly important because fluorine has a relatively long residence time in most chemical deposition chambers. The present inventors, however, discovered that this conventional thinking may result in the deposition of FSG layers having less than optimal properties in some instances. Specifically, the present inventors discovered that nozzle length affects the stability of FSG layers deposited from fluorine sources such as $SiF_4$ in some processes. The inventors discovered that in addition to the uniform distribution of fluorine species across the substrate surface, that the uniform distribution of $SiF_x$ species (e.g., SiF, $SiF_2$, $SiF_3$) across the substrate surface helps create a stable FSG layer. When relatively short nozzles for the fluorine source are used, $SiF_x$ species are not distributed uniformly across the entire substrate surface. It is believed that the uneven distribution of $SiF_x$ species may result across the substrate surface. Thus, when $SiF_x$ species are formed near the orifices of the short nozzles, it is harder for the $SiF_x$ species to reach all areas of the wafer (e.g., the center). Instead, it is believed that the exhaust system pumps many of the $SiF_x$ species out of the chamber before they reach certain areas of the wafer, creating an uneven distribution of $SiF_x$ across the wafer with the center of the wafer receiving less $SiF_x$ than the perimeter.

In accordance with an embodiment of the invention, a method of forming a doped dielectric layer on a substrate surface in a process chamber includes injecting a first process gas containing precursor of a dielectric material into the process chamber at a first distance from a periphery of the substrate surface. A second process gas containing dopant species is injected into the process chamber at a second distance from the periphery of the substrate surface. The second process gas reacts with the first process gas in the process chamber to deposit a doped dielectric layer on the substrate surface. The second distance is substantially equal to or smaller than the first distance so as to distribute the dopant species substantially uniformly over the substrate surface to deposit a stable doped dielectric layer on the substrate and to better control the dopant level. In specific embodiments, the first distance ranges between about 1.75 and about 3.5 inches, and more preferably between about 2.75 and 3.25 inches; the second distance ranges between about 1.75 and about 3.5 inches, and more preferably between about 1.75 and 2.25 inches.

In accordance with another embodiment, an apparatus for forming a film on a substrate surface of a substrate disposed in a chamber defined by a housing includes a first plurality of nozzles extending into the chamber for introducing a first chemical containing precursor of a dielectric material at substantially a first distance from a periphery of the substrate surface. A second plurality of nozzles extend into the chamber for introducing a second chemical containing dopant species at substantially a second distance from the periphery of the substrate surface. The second distance is substantially equal to or smaller than the first distance. In some embodiments, the apparatus includes a removable ring having openings for receiving the first plurality of nozzles and second plurality of nozzles. In a specific embodiment, the housing includes a plurality of slots and a plurality of ring portions that are releasably inserted into the plurality of slots. The plurality of ring portions have openings for receiving the first plurality of nozzles and second plurality of nozzles.

In accordance with another embodiment of the invention, a method of forming a doped dielectric layer on a substrate surface in a process chamber includes injecting a first process gas containing precursor of a dielectric material into the process chamber at a first distance from a periphery of the substrate surface, and injecting a second process gas containing fluorine dopant species into the process chamber at a second distance from the periphery of the substrate surface. The second process gas reacts with the first process gas in the process chamber to deposit a dielectric layer containing fluorine on the substrate surface. The second distance is substantially equal to or smaller than the first distance.

In another embodiment of the present invention an apparatus is provided for use in a chemical vapor deposition system. In this embodiment, the deposition system includes a housing defining a chamber and a substrate support for supporting a substrate disposed within the chamber. The apparatus includes a gas ring having multiple openings disposed about an inner periphery of the ring. Some of the multiple openings couple to first nozzles that extend within the inner periphery to inject a first chemical into the chamber. Others of the multiple openings couple to second nozzles that extend within the inner periphery to inject a second chemical into the chamber. The distance that each of the first and second sets of multiple nozzles extend into the inner periphery is optimized and selected so that during use of the deposition system the desired first and second chemicals are substantially uniformly distributed across the substrate surface and so that reactant products (e.g., species) formed from the first and second chemicals that effect deposition uniformity are also uniformly distributed across the substrate surface with more uniform chemical properties. The present invention provides an apparatus that allows for uniform deposition of a variety of different film types within a single chamber without complicated hardware adjustments to the chamber.

These and other embodiments of the present invention, as well as some of its advantages and features are described in more detail in conjunction with the text below and attached figures.

DESCRIPTION OF THE SPECIFIC EMBODIMENTS

Figure 1:
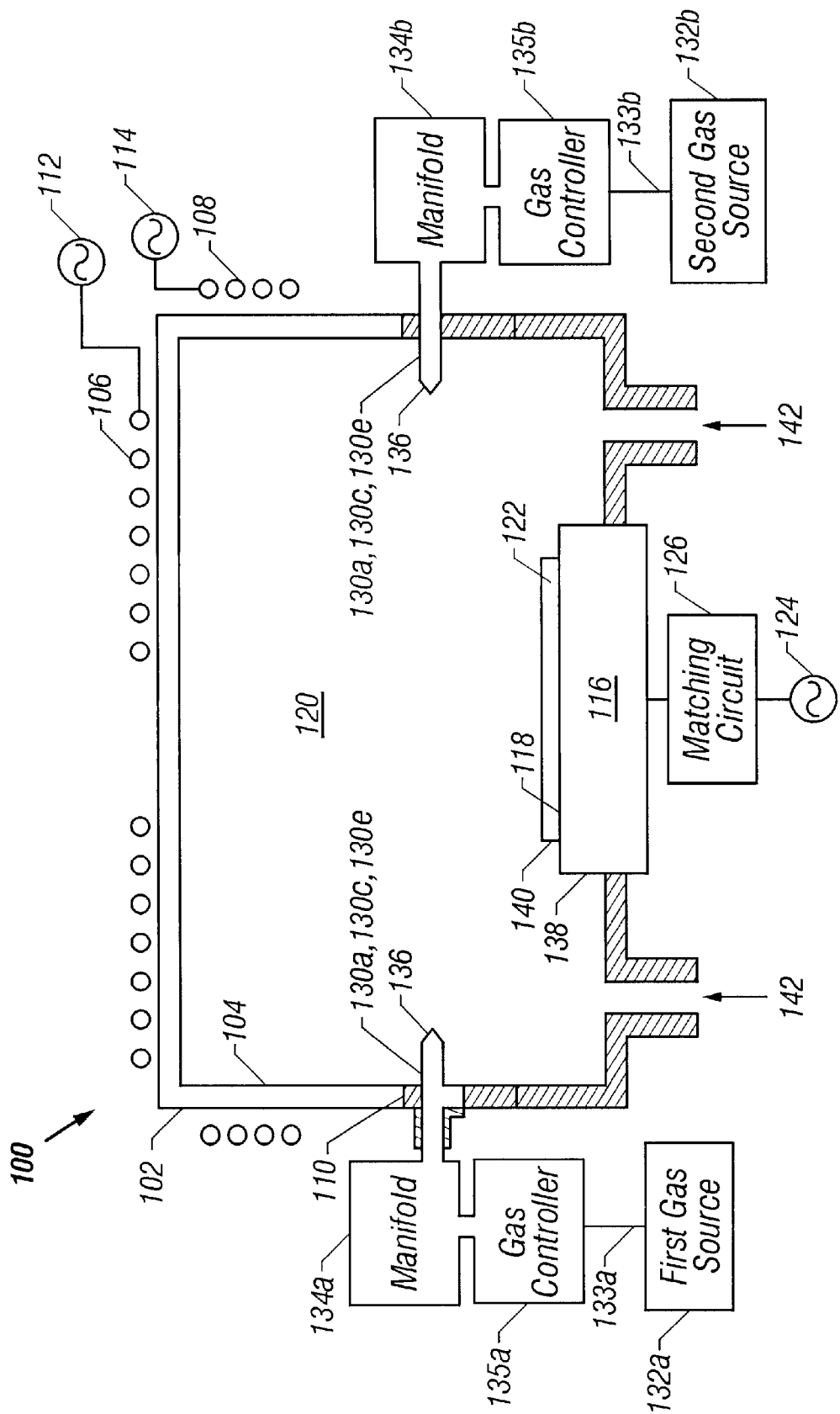
FIG. 1 is a simplified cross sectional view of a substrate processing chamber according to the present invention.

FIG. 1 illustrates a simplified substrate processing system 100 according to an embodiment of the present invention. In this embodiment, a housing 102 defines a chamber 120, which is typically a vacuum chamber. Housing 102 includes an enclosure 104 surrounded by two sets of RF inductive coils 106 and 108. Enclosure 104 couples to a gas injection ring 110. Housing 102 typically has a generally cylindrical inner periphery, but may take other shapes or forms. Enclosure 104 is made from a dielectric material such as ceramic. Coils 106, 108 are typically powered by a pair of source RF sources 112 and 114.

Also included in system 100 is a substrate support 116 having a substrate support surface 118 within vacuum chamber 120. The substrate support surface 118 supports a wafer or substrate 122 within the vacuum chamber 120 during substrate processing. A bias RF source 124 is typically applied to substrate support through an RF matching circuit 126 causing support surface 118 with an electric-static chuck to act as a cathode. A sidewall 128 connects a bottom portion of housing 102 to enclosure 104 and acts as an anode.

Figure 2A:
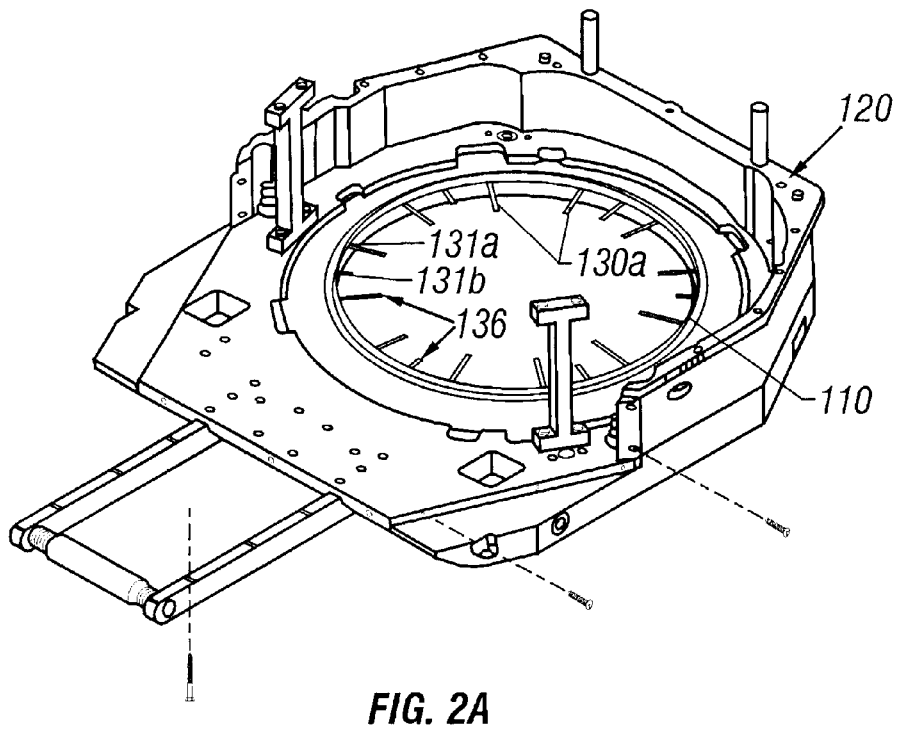
FIG. 2A is a perspective view of the interior of the substrate processing chamber of FIG. 1 according to a prior art arrangement of nozzles.
Figure 2B:
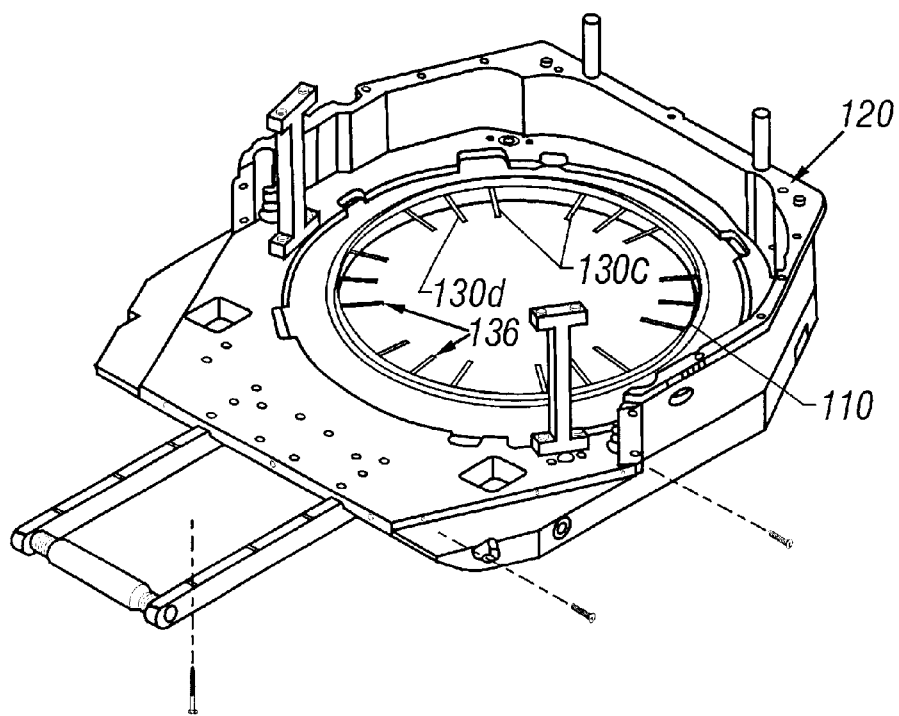
FIG. 2B is a perspective view of the interior of the substrate processing chamber of FIG. 1 according to an embodiment of the present invention.
Figure 2C:
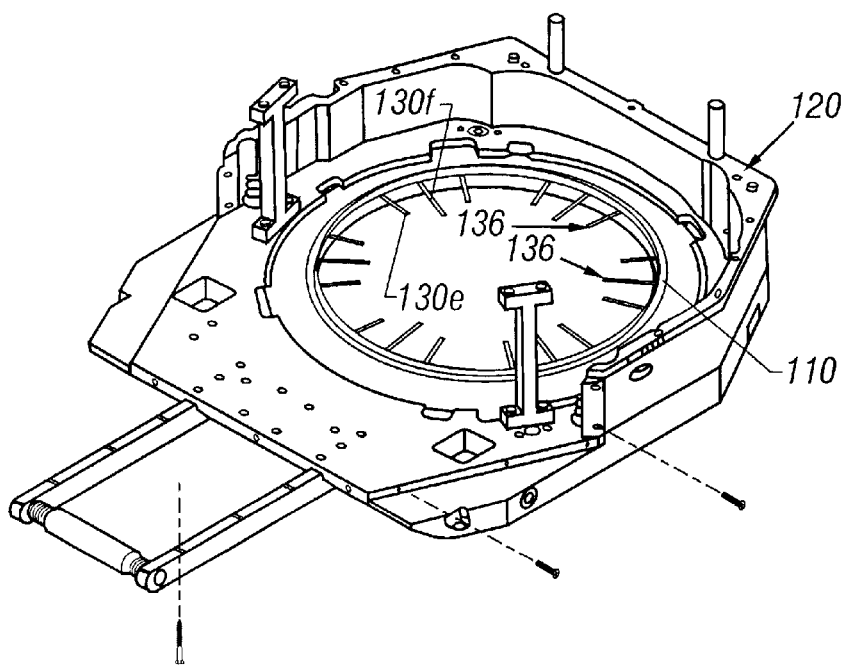
FIG. 2C is a perspective view of the interior of the substrate processing chamber of FIG. 1 according to another embodiment of the present invention.

Referring to the perspective views of the interior of vacuum chamber 120 of FIGS. 2A–2C, process gases are introduced to vacuum chamber 120 in the region of substrate 122 through sets of gas distributors or nozzles. The configuration of gas nozzles 130a, 130b of a known system (FIG. 2A) is compared with sets of nozzles of two specific embodiments (130c, 130d in FIG. 2B and 130e, 130f in FIG. 2C) of the present invention. In this example, the known system of FIG. 2A shows a set of 12 long gas nozzles 130a and a set of 6 short gas nozzles 130b. Each set is substantially evenly spaced around the circumference of gas injection ring 110. In the first embodiment of the present invention as shown in FIG. 2B, gas nozzles 130c, 130d are substantially the same in length. In the second embodiment of the invention as shown in FIG. 2C, gas nozzles 130f are longer than gas nozzles 130e. The differences between the three configurations of FIGS. 2A–2C are discussed below.

Nozzles (130a and 130b of FIG. 2A; 130c and 130d of FIG. 2B; or 130e and 130f of FIG. 2C) are disposed, respectively, at openings 131a, 131b in gas ring 110. Each nozzle has an orifice 136 at its distal end. Orifices 136 of the nozzles are arranged above a periphery 138 of substrate support 116 and thus above a periphery 140 of substrate 122, as best seen in FIG. 1. Each set of nozzles (130a and 130b; 130c and 130d; or 130e and 130f) is coupled to a respective gas manifold 134a, 134b. Manifolds 134a and 134b are fed process gases from first and second gas sources 132a and 132b. Gas sources 132a, 132b are connected to manifolds 134a, 134b via gas lines 133a, 133b and gas controllers 135a, 135b. In a preferred embodiment, gas controllers 135a and 135b are gas valves that are opened, closed and otherwise adjusted to control gas flow by a computer processor as described in more detail below. Chamber 120 exhausts unused process gases and reaction byproducts through the bottom port of the chamber body symmetrically which is illustrated in FIG. 1 as an exhaust port 142, which is annular in the embodiment illustrated in FIG. 1. In a plasma-enhanced process, a plasma is formed from gases introduced into the chamber through nozzles by the application of RF power from RF sources 112 and 114.

The term nozzle should not be read in a restrictive manner. As used in this description, the term nozzle applies to any member or device that can direct gases for injection into the chamber. The nozzle need only have a length and an ability to direct gases through one or more openings in the nozzle. The nozzles are typically equally spaced about the interior of chamber 120 for even distribution around substrate 122 with symmetrical pumping. In the embodiments shown (e.g., FIG. 2C), nozzles injecting different gases are interleaved about the interior of chamber 120 with 12 equally spaced nozzles 130e injecting a first gas and 6 equally spaced nozzles 130f, disposed among the other 12 nozzles 130e, injecting a second gas. Typically, nozzles 130e are substantially equal in length while nozzles 130f are substantially equal in length for achieving uniformity of gas distribution around periphery 140 of substrate 122. The nozzles in accordance with the present invention may be arranged in a variety of patterns about the chamber walls and are not limited to the arrangements shown in FIGS. 2B and 2C, which are provided merely for illustrative purposes and for comparison with the known configuration of FIG. 2A.

Gases may also be injected from other locations in chamber 120 such as from a position generally above substrate 122. Such a configuration may include a center-chamber source such as a nozzle (not shown) located above the substrate, and possibly an additional opening (also not shown) disposed about the nozzle. Applied Materials, Inc., assignee of the present invention, pioneered this type of configuration which is described in U.S. Ser. No. 08/851,856, filed May 6, 1997, entitled "AN IMPROVED DEPOSITION CHAMBER AND METHOD FOR DEPOSITING LOW DIELECTRIC CONSTANT FILMS," also assigned to Applied Materials, Inc.

A computer processor (not shown) controls gas controllers 135a, 135b. The processor operates under the control of a computer program stored in a computer-readable medium (also not shown). The computer program dictates various operating parameters including, but not limited to, desired chemical(s), timing, mixture of chemicals, chamber pressure, substrate support temperature and RF power levels. The computer program may be implemented using software, hardware, firmware, or a combination of any of these consolidated in a single location or distributed throughout the system.

Referring again to FIGS. 1 and 2A–2C, the locations of orifices 136, where gases enter chamber 120, effect uniformity of the formed film depending on various factors. When different processes are used, it may be desirable to inject various gases all at the same relative distance from wafer 122, or at different relative distances from wafer 122 depending on the chemicals injected. For example, if a chemical with a relatively short residence time is injected through an orifice, it is often desirable to have the orifice located relatively close to periphery 140 of substrate 122 to ensure that the chemical will be uniformly distributed across the entire substrate surface and to obtain the desired chemical composition.

The present inventors have discovered that the relative distances for introducing source chemicals with respect to the substrate 122 in chamber 120 can have significant effects on the uniformity and stability of the film formed on the substrate 122 from reaction of the source chemicals. For example, a first chemical injected into chamber 120 reacts with a second chemical (or chemicals) injected into chamber 120 to form precursor species (or reactant products) from the first chemical and the second chemical for depositing a film on the substrate 122. If the precursor species from the second chemical has a relatively short residence time compared with the other species, the second chemical should be injected from an orifice relatively close to the periphery 140 of the substrate 122 when the reactive species from the second chemical has an effect on film uniformity. This helps ensure that the reactive species from the second chemical (which has a relatively short residence time) is also uniformly distributed across the entire substrate surface. An example of a first chemical is $SiH_4$. Examples of a second chemical which produces reactive species that has an effect on film uniformity include dopants used to form doped dielectric films such as doped silicate glass films. For instance, the present inventors have discovered that during the deposition of an FSG film in an HDP-CVD chamber from $SiF_4$, $SiH_4$ and $O_2$ sources, $SiF_x$ species (e.g., $SiF_3$, $SiF_2$ and $SiF$) formed by chemical reactions within chamber 120 can have a relatively short residence time within chamber 120. Accordingly, the present inventors have discovered that it is important to introduce the $SiF_4$ fluorine source in such a configuration from an orifice relatively close to periphery 140 of substrate 122.

The different relative lengths of nozzles for the three arrangements shown in FIGS. 2A–2C define different relative distances between orifices 136 and periphery 140 of substrate 122, and have an effect on the properties of the deposited film. The comparison is illustrated using the example of depositing an FSG film from $SiF_4$, $SiH_4$ and $O_2$ sources, but the invention is not limited to this particular process. In the prior configuration of FIG. 2A, 12 long nozzles 130a are used to inject $SiH_4$, while 6 short nozzles 130b are used to inject $SiF_4$. Short nozzles may be used for injecting a combination of $SiF_4$ and $O_2$, or other ways of injecting $O_2$ into chamber 120 may be used. In accordance with the present invention, the $SiF_4$ fluorine source is introduced through orifices 136 that are relatively closer to periphery 140 of substrate 122 than the prior arrangement of FIG. 2A. In FIG. 2B, the relative increase in length of nozzles 130d moves orifices 136 for introducing $SiF_4$ relatively closer to periphery 140 so that nozzles 130d are substantially equal in length to nozzles 130c for introducing $SiH_4$. Although FIG. 2B shows 6 nozzles 130d and 12 nozzles 130c, the number and the circumferential spacing of these nozzles 130c, 130d may be varied in other embodiments. In FIG. 2C, nozzles 130f for introducing $SiF_4$ are longer than nozzles 130e for introducing $SiH_4$. FIG. 2C shows 6 nozzles 130f and 12 nozzles 130e, although other numbers and circumferential spacings of nozzles 130e, 130f may be used.

As illustrated in FIGS. 2B and 2C, the present invention employs nozzles (130d or 130f) for introducing $SiF_4$ that are as long or longer than nozzles (130c or 130e) for introducing $SiH_4$ to improve deposition uniformity of the FSG film. Thus, the distance between periphery 140 of substrate 122 and orifices 136 of $SiF_4$ nozzles (130d or 130f) is substantially equal to or smaller than the distance between periphery 140 and orifices 136 of $SiH_4$ nozzles (130c or 130e). These relative distances can be selected and optimized based on parameters that include the numbers and circumferential spacings of the nozzles, which in turn determine the locations of mixing and reaction of the gases introduced into chamber 120. Other factors that influence the design of the nozzles include orifice size of the orifices 136 and flow rate of the gas fed through the orifices 136. The nozzles lie generally on the same plane, and typically are vertically spaced above the upper surface of the substrate 122. Although it is possible to vary the vertical distance to optimize a particular process, the constraints of the hardware design (e.g., RF coil position, pumping speed, pump position, chamber shape) often limit or prevent its variation in practice. Thus, the vertical distance of the nozzles are generally fixed from a practical standpoint.

In the embodiment shown in FIG. 2B, the vertical distance of the orifices 136 of the nozzles 130c, 130d from the upper surface of the substrate 122 ranges between about 1.5 to 2.0 inches, and is typically about 1.75 inches. The horizontal distance between periphery 140 of substrate 122 and orifices 136 of both nozzles 130c, 130d is substantially uniform and equal to between about 1 and 3.5 inches, more preferably between about 1.25 and 2.5 inches. In a specific example, the distance is about 2.0 inches. The diameter of the substrate 122 is typically about 150–300 mm.

In the embodiment shown in FIG. 2C, the vertical distance of the orifices 136 of the nozzles 130e, 130f from the upper surface of the substrate 122 ranges between about 1.5 to 2.0 inches, and is typically about 1.75 inches. The distance between periphery 140 of substrate 122 and orifices 136 of short nozzles 130e is equal to between about 1.75 and 3.5 inches, more preferably between about 2.75 and 3.25 inches, while the distance between periphery 140 and orifices 136 of long nozzles 130f is equal to between about 1.75 and 3.5 inches, more preferably between about 1.75 and 2.25 inches. In a specific example, the distance between periphery 140 and orifices 136 of short nozzles 130e is about 3.175 inches, and the distance between periphery 140 and orifices 136 of long nozzles 130f is about 1.75 inches. The diameter of the substrate 122 is typically about 150–300 mm.

In addition to improved film properties of the deposited film, the present invention has other advantages. For instance, in the FSG film example, the fluorine from $SiF_4$ is relatively unstable, and it also attacks the wall of chamber 120. Introducing $SiF_4$ closer to substrate 122 tends to produce a more stable film as it reacts with $SiH_4$ and $O_2$ over substrate 122. Because $SiF_4$ is introduced closer to the substrate 122 and away from the wall of chamber 120 than previously done, the attack of the chamber wall by fluorine is diminished, thereby reducing overall contamination of the chamber wall and hardware deterioration. Moreover, the present invention provides flexibility and control of the location of injected chemicals (and therefore distance between the injection location and the wafer) to compensate for situations such as different recipes, multiple chemicals injected via one nozzle, and different substrate sizes.

Figure 3:
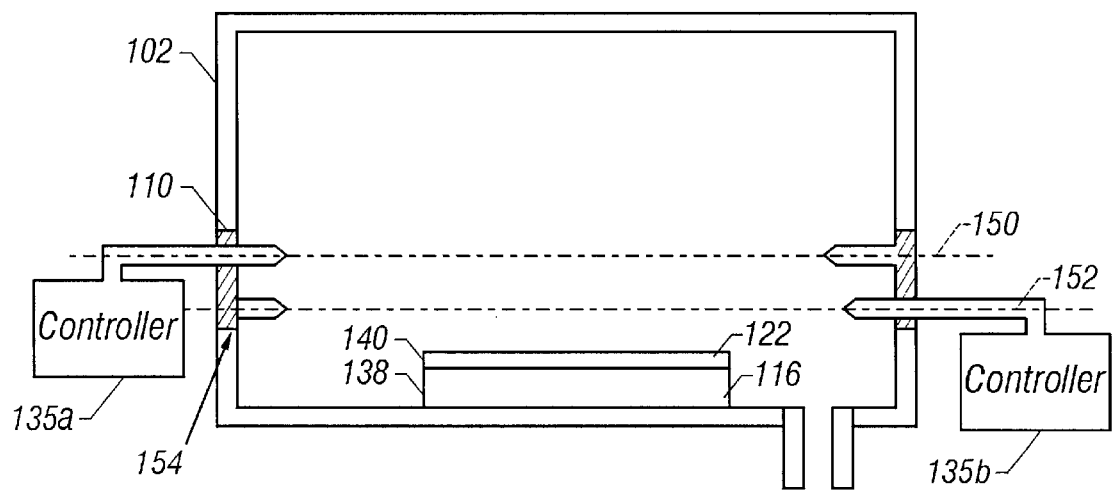
FIG. 3 is a simplified cross sectional view of a substrate processing chamber employing multiple layers of nozzles according to another embodiment of the present invention.

Referring to FIGS. 1, 2B, and 2C, nozzles (130c and 130d; or 130e and 130f) couple to gas ring 110, which is in turn coupled to chemical controllers 135a and 135b. Ring 110 may be of various configurations including layers of openings and/or various couplings of the openings. Manifolds 134a, 134b may reside in ring 110, in housing 102, or in both. Generally, housing 102 couples to ring 110 as shown in FIG. 1. In the embodiments of FIGS. 2B and 2C, ring 110 is a single continuous ring. In other embodiments, however, it is possible to couple the gas nozzles to chemical controllers 135a and 135b within housing 102 itself thus eliminating the need for gas ring 110. Yet other embodiments use multiple layers of nozzles positioned along gas ring 110. As shown in the example of FIG. 3, two layers of nozzles are used, the first layer being disposed substantially along a first plane 150 and the second layer disposed substantially along a second plane 152. The first and second planes are disposed at first and second distances away from a bottom surface 154 of the ring 110.

Figure 4:
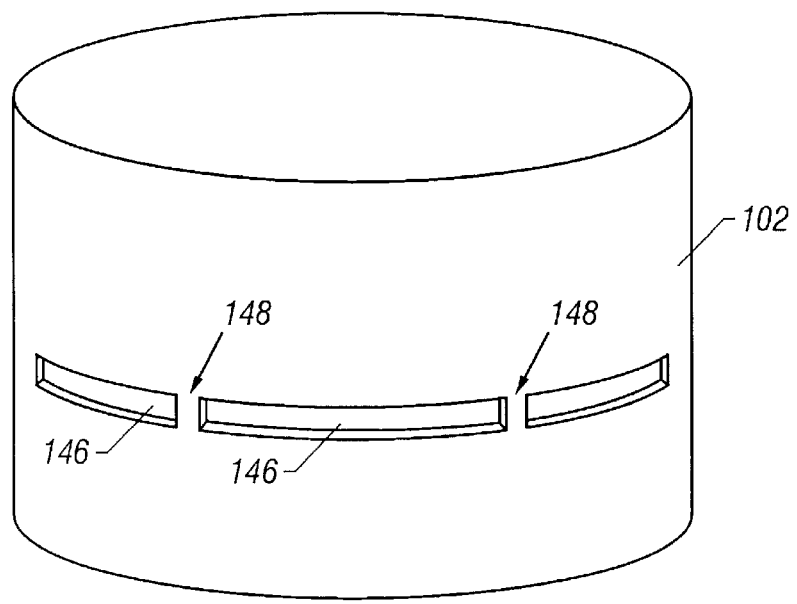
FIG. 4 is an exterior view of a simplified substrate processing chamber housing for use with a segmented ring according to an embodiment of the present invention.
Figure 5A:
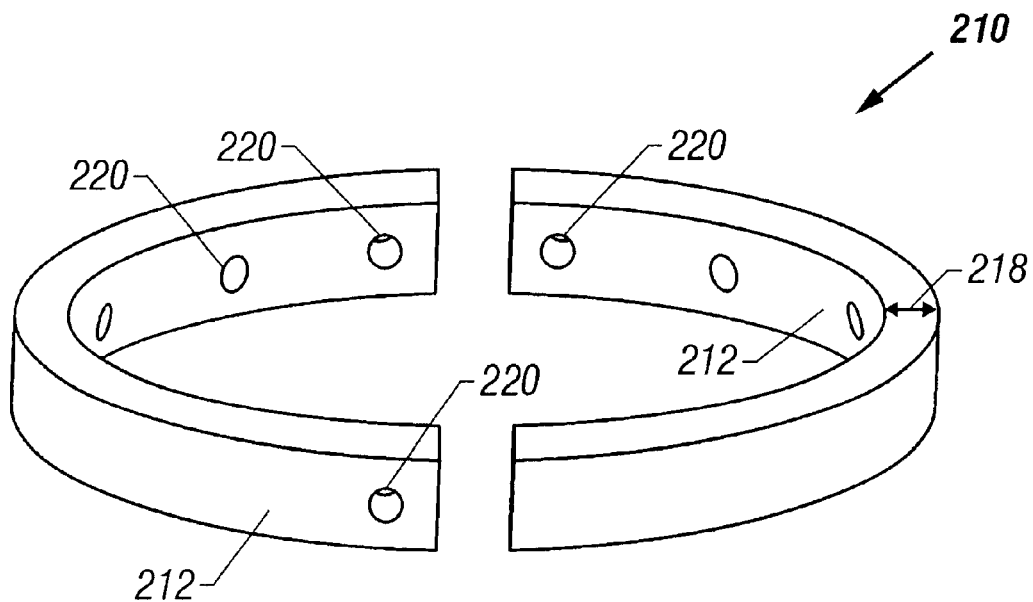
FIGS. 5A and 5B are simplified perspective views of embodiments of segmented rings, for use with a substrate processing chamber, according to the present invention.
Figure 5B:
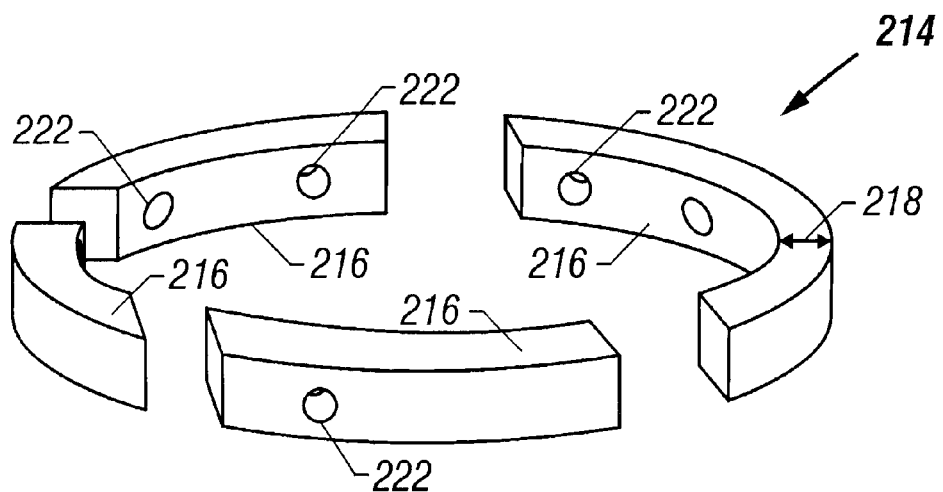

In other embodiments, ring 110 may be formed from more than one piece. When ring 110 is formed of several portions, housing 102 typically includes multiple openings or slots 146 adapted to receive the various ring portions. Each slot 146 is separated by supports 148, as shown in the embodiment of FIG. 4. Also, provisions for gas flow within the gas manifolds of the multi-piece ring need to be made. This can be done, for instance, by connecting chemical sources 132a, 132b to multiple locations on the multi-piece ring or providing gas passageways in housing 104 that communicate to other pathways in each ring portion of the multi-piece ring as appropriate. Examples of a two-piece gas ring 210 having two ring portions 212 and a four-piece gas ring 214 having four ring portions 216 are respectively shown in FIGS. 5A and 5B. The ring portions 212, 216 have a thickness 218 typically matching the thickness of housing 102. Each ring portion 212 of two-piece ring 210 has a plurality of openings 220 and each ring portion 216 of four-piece ring 214 has a plurality of openings 222 for receiving nozzles. As shown in FIGS. 5A and 5B, the ring portions 212, 216 need not have the same size or have the same number of openings 220, 222.

Whether the gas ring is a continuous piece or has multiple pieces, the ring is preferably removably mounted to housing 102 in order to allow quick and easy servicing and interchangeability. The nozzles may be removably or permanently mounted to the openings on the inner periphery of the ring. Removably mountable nozzles allow the nozzles to be separated from the ring for maintenance, cleaning, and other purposes. Removably mountable nozzles also allow nozzles of different length combinations to be used for various processes without replacing the ring.

In another embodiment the present invention controls the location of chemical injection by providing nozzles whose orifice locations are adjustable. For example, openings in the housing may be adapted with threads to receive a mating threading on the nozzles. Thus the nozzles could have their orifice locations varied by turning the nozzles clockwise and counterclockwise. This adjustment may be accomplished from the exterior of the housing. Alternatively, a nozzle may be unscrewed completely and replaced with a different nozzle that is inserted into the place of the nozzle that has been removed. In this respect nozzles could be inserted all the way in to their limits to ensure a tight seal with the housing while providing flexibility as to nozzle length and therefore nozzle orifice location. Alternatively, the nozzles may be provided that have extendible or telescoping lengths. Using such nozzles would allow orifice location adjustment by merely extending or retracting the nozzle. Again, one of skill will see other forms of adjustable orifice locations. The above description are thus exemplary and not an exhaustive list of possibilities within the scope of this invention.

Of course, various combinations of rings, selective controlling of chemical delivery to nozzles, and adjustable nozzles as described above may be combined in order to realize advantages of more than one of the individual techniques. Additionally, any of these techniques, or others, may be used, alone or in combination with each other, with many configurations of the housing.

Figure 6:
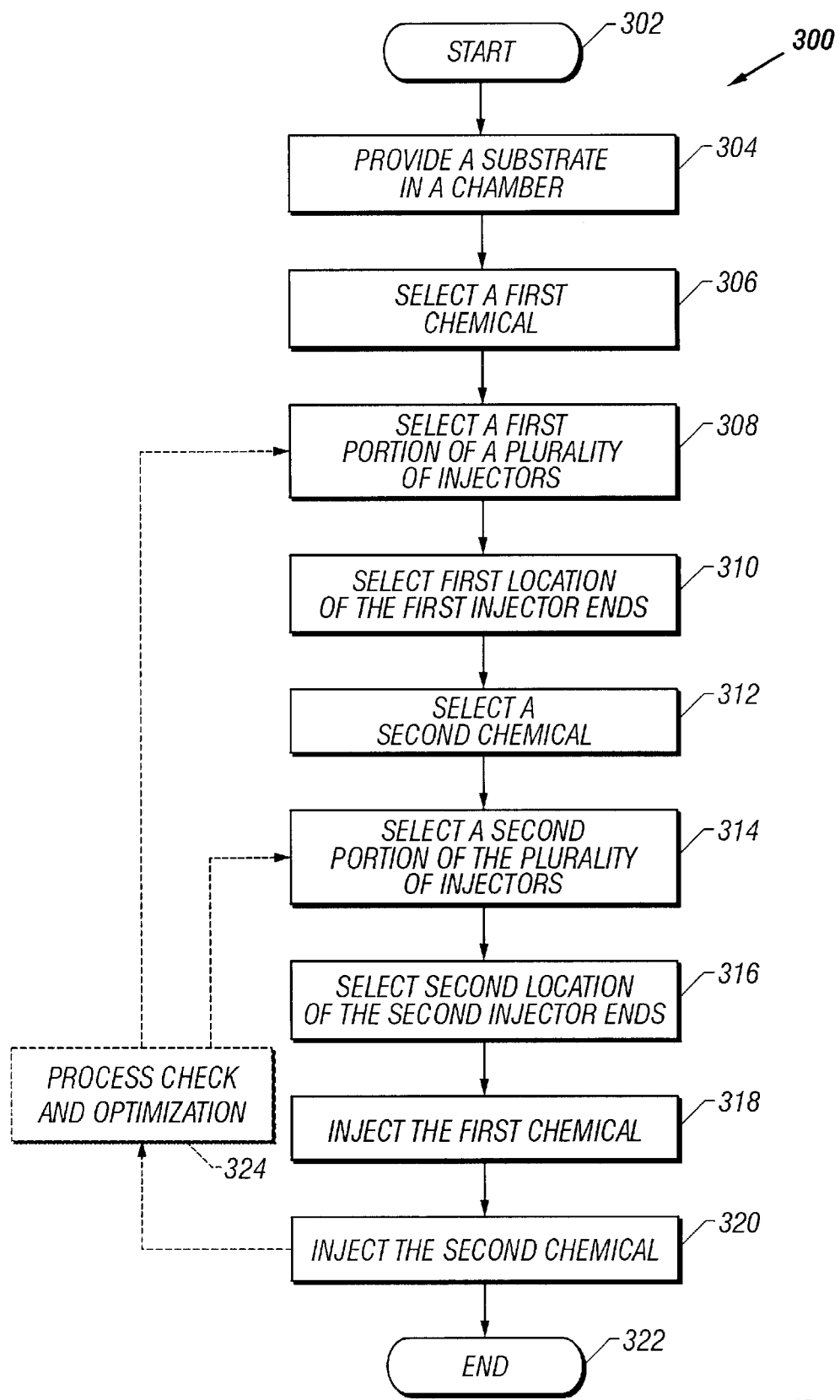
FIG. 6 provides a simplified flow diagram of a substrate processing method employing multiple gas nozzles according to an embodiment of the present invention.

The simplified flow chart 300 of FIG. 6 illustrates the use of the multiple nozzle system 100 of FIG. 1 with nozzle distributions such as those of FIG. 2B or 2C for depositing a film on the substrate and for establishing conditions for providing improved deposition of the film. At the start 302 of the process, a substrate is provided in the chamber at step 304. A first chemical is selected (step 306), and a first portion of a plurality of injectors or nozzles are selected (step 308). For instance, all or part of nozzles 130c in FIG. 2B (or nozzles 130e in FIG. 2C) are selected during this step. Selectively using all or a subset of the available nozzles adds flexibility to the processing system. The first location of the ends or orifices of the first injectors are selected in step 310, thereby defining the first distance between the orifices of the first injectors and the periphery of substrate. As discussed above, the first distance can be adjusted by changing the first injectors or adjusting their length. A second chemical is selected in step 312 and a second portion of the plurality of injectors are selected in step 314. For instance, all or part of nozzles 130d in FIG. 2B (or nozzles 130f in FIG. 2C) are selected in step 314. The second location of the second injector ends or orifices are selected in step 316 to define a second distance between the orifices of the second injectors and the periphery of the substrate. The preferred first distance and second distance can be selected based on factors such as the flow pattern, orifice size of the nozzles, input gases, flow rates, process pressure, and film uniformity observed from a partial deposition. In specific embodiments, the second distance is substantially equal to the first distance (FIG. 2B) or is smaller than the first distance (FIG. 2C). The first and second chemicals are injected during steps 318 and 320 to react in the chamber to form a film on the surface of the substrate at the end 322 of the process. Advantageously, the first and second chemicals, the locations of the first and second injectors, and the first and second locations of the first and second injector orifices which define the first and second distances from the periphery of the substrate, are selected to form a film having a desired chemical composition of a substantially uniform distribution on the surface of the substrate. Process check 324 is typically performed by adjusting the selection of the first portion of the plurality of injectors (step 308) and the selection of the second portion of the plurality of injectors (step 314) to optimize the process.

The above description is exemplary only and not intended to restrict, confine, or limit the present invention to only this description. For example, the selecting steps need not occur in the order shown although the step of selecting the first orifice location(s) typically occurs after the step of selecting the first chemical and likewise for the second orifice location (s) and second chemical. The injecting steps may occur simultaneously, or substantially so.

In a preferred embodiment the present invention deposits FSG films from silane, oxygen and $SiF_4$ gases. In this embodiment, the present invention preferably supplies a combination of $SiF_4$ and oxygen from a six-nozzle gas ring into the vacuum chamber, although the gas mixture may be introduced through more nozzles (e.g., 12 nozzles) as desired for particular processes. Doing this simplifies the delivery of these gases and helps reduce cost. These gases may be introduced through a single gas ring because these gases do not react quickly with each other at room temperature.

Depositing FSG films using silane, oxygen and $SiF_4$ gases may result in films that have stability properties that are unacceptable for some applications if the fluorine concentration of the film is not uniformly distributed across the substrate surface. The fluorine dopant in FSG can come from $SiF_x$ or from single fluorine molecules dissociated from the $SiF_4$. The $SiF_x$ molecules tend to yield a more stable film than the single fluorine molecules because the fluorine in $SiF_x$ is bonded to silicon atoms. Therefore it is desirable to uniformly distribute the $SiF_x$ molecules across the substrate surface.

Presently used techniques, however, tend to create unacceptable films for some applications when depositing FSG films using silane, oxygen and $SiF_4$ gases. For instance, the FSG film may have loosely bonded fluorine atoms that result in $H_2O$, H, or OH absorption and subsequent undesirable $H_2O$, H, or OH and hydrofluorine (HF) outgassing at levels that do not fall within manufacturing requirements of certain applications, such as intermetal dielectric application of integrated semiconductor devices. The inventors of the present invention discovered that introducing $SiF_4$ and oxygen through a single gas ring, which has historically been short for the introduction of oxygen (i.e., disposed far from the substrate), yielded unacceptable films. It is believed that the explanation for this phenomenon is that the $SiF_x$ compounds were too heavy to be uniformly distributed across the substrate surface when injected from a short nozzle disposed at a substantial distance from the periphery of the substrate, while single molecule F, which is lighter than $SiF_x$ and have relatively longer resident life in the chamber, reacted with the silicon and oxygen to form the FSG film. Further, it is believed that the $SiF_x$ species were exhausted from the chamber before they could reach the center region of the substrate surface. In addition, the inventors have found that the injection of oxygen should also take place in close proximity to the wafer surface. Conventional CVD oxide is made with excessive oxygen as the background reaction gas in the chamber to make sure the oxide is fully oxidized. In FSG processes, however, oxygen and fluorine directly compete for silicon bonds, so it is undesirable to inject excessive oxygen in the chamber. Rather, it is important that both oxygen and fluorine source gases be fed into the chamber under a controllable way to achieve desired, stable film properties. The inventors have discovered that using nozzles positioned around the periphery of the substrate for injecting the $SiF_4$ and oxygen that are approximately equal in length to or longer than nozzles for injecting the $SiH_4$ yielded more stable FSG films.

Figure 7A:
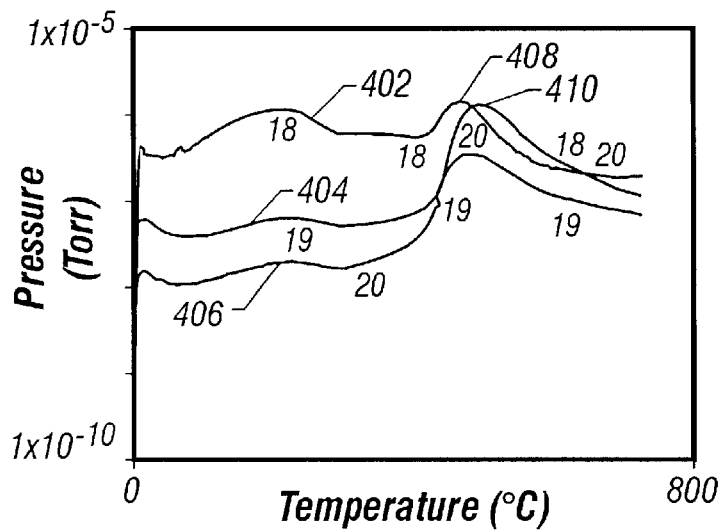
FIG. 7A illustrates outgassing test results of an FSG film deposited according to a prior-art technique.
Figure 7B:
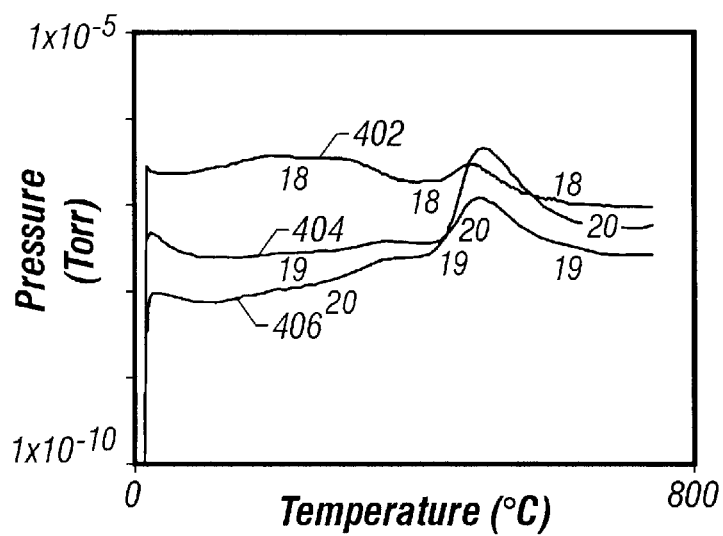
FIGS. 7B and 7C show outgassing test results of FSG films deposited employing substantially equal-length nozzles in accordance with an embodiment of the present invention.
Figure 7C:
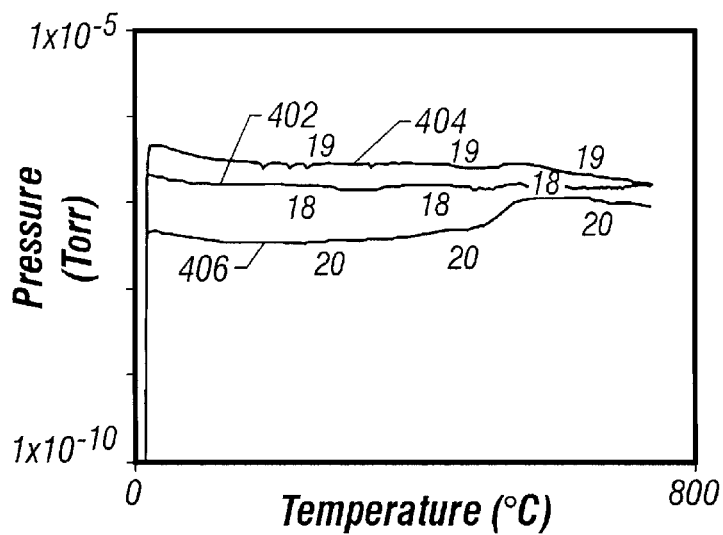

FIGS. 7A–7C illustrate results from tests performed by the inventors of the present invention. FIGS. 7A–7C are thermal desorption spectroscopy (TDS) graphs, as well understood by those of ordinary skill in the art. The configurations of chamber 120 and the processes used are described below. All the chamber configurations included introducing gas from the side walls of chamber 120 and from a location generally centrally located above substrate 122. In each case chamber housing 102 employed was that of an HDP Ultima CVD chamber manufactured by Applied Materials (assignee of the present invention) and outfitted for 200 mm wafers. The vertical distance of the orifices of the nozzles from the upper surface of the wafer is about 1.75 inches.

In these figures, trace 402 represents outgassing of $H_2O$, trace 404 represents the outgassing of fluorine, and trace 406 represents the outgassing of hydrofluorine (HF). Ideally these traces are relatively flat with temperatures up to about 500° C., with variations from level traces such as peaks 408 and 410 in FIG. 7A representing undesired outgassing of $H_2O$ and HF respectively.

FIG. 7A illustrates results from a prior-art FSG deposition process using silane, oxygen and $SiF_4$ gases where the oxygen and $SiF_4$ gases were injected into a vacuum chamber through short nozzles approximately 0.5 inches into the chamber long and the $SiH_4$ gas was injected through long nozzles extending approximately 2.5 inches into the chamber. The horizontal distance between the orifices of the short nozzles and the periphery of the substrate is about 2.625 inches, while the horizontal distance between the orifices of the long nozzles and the periphery of the substrate is about 1 inch. A process of 400° C.±15° C. wafer temperature, 6 mtorr process chamber pressure, 900 W top RF coil, 2300 W side RF coil, 2500 W bias RF, 89.7 sccm $O_2$ (with 5.7 sccm from a center-chamber source), 45.5 sccm $SiH_4$ (with 4.5 sccm from a center-chamber source), 32 sccm $SiF_4$, and 54 sccm Ar (with 9 sccm from a center-chamber source). This process represents an attempt at optimization of the process given the deposition system configuration. Each of the traces shows signs of outgassing. Peaks in the traces appear at approximately 210° C. and 480–505° C., indicating outgassing at these temperatures due to physical desorption and chemical desorption, respectively.

FIGS. 7B and 7C represent outgassing measurements from films deposited using nozzles for the $SiH_4$, $O_2$, and $SiF_4$ gases that were all approximately 2.5 inches in length, so that the horizontal distance between the orifices of the nozzles and the periphery of the substrate is about 1 inch. FIG. 7B shows results when a film is deposited using the same process as used for FIG. 7A. FIG. 7C illustrates results when the process is adjusted in an attempt to optimize properties of the film with the nozzle configuration.

Comparing FIG. 7A with 7B, it is evident that switching to injecting the $SiH_4$ from nozzles that are approximately the same length as the nozzles for injecting the $SiF_4$ and oxygen yields a deposited film with improved stability. Each of traces 402–406 has improved flatness in FIG. 7B as compared to FIG. 7A. Some outgassing, however, still occurs as evident from peaks in the traces at about 480–505° C., although the traces are relatively flat where peaks previously existed at about 210° C.

Referring to FIG. 7C, it is further evident that the use of approximately equal-length nozzles for injecting the $SiH_4$ and for injecting the $SiF_4$ and oxygen allows for improved film stability. After optimizing the process, the film deposited with the new recipe yields improved flatness in traces 402–406 with increasing temperature as seen in FIG. 7C. The flatness of the traces in FIG. 7C indicates a reduction in outgassing particularly around a temperature of about 500° C., and therefore an increase in film stability, compared to films represented in FIGS. 7A and 7B.

Figure 8:
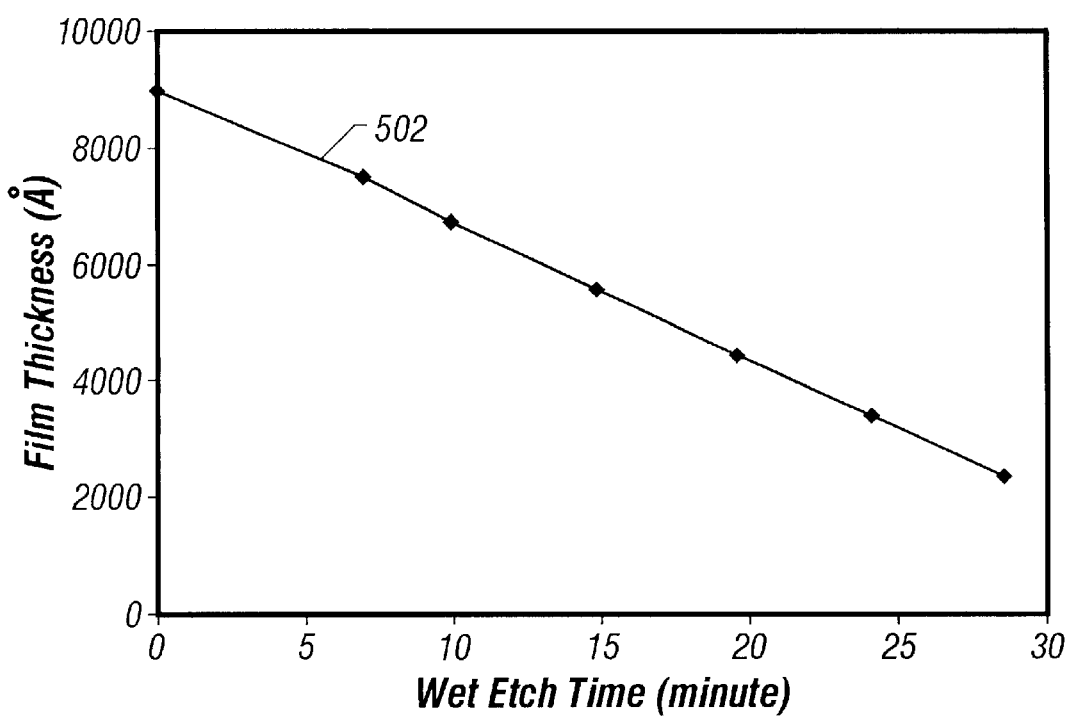
FIG. 8 shows wet etching test results of an FSG film deposited employing substantially equal-length nozzles in accordance with an embodiment of the present invention.

FIG. 8 further illustrates test results indicating that the use of approximately equal-length nozzles for injection of the $SiH_4$, $SiF_4$ and oxygen improves the quality of the deposited film. This figure indicates results from wet etching of a film deposited using nozzles of approximately equal length and the recipe yielding the results of FIG. 7C. Ideally, trace 502 which is the wet etch rate versus film thickness shown in FIG. 8 should be linear. Wet etch rate is an indicator of fluorine concentration in the film. As can be seen from FIG. 8, trace 502 is very close to being linear, indicating a very nearly ideal film deposition from the bottom of the substrate to the top.

Figure 9A:
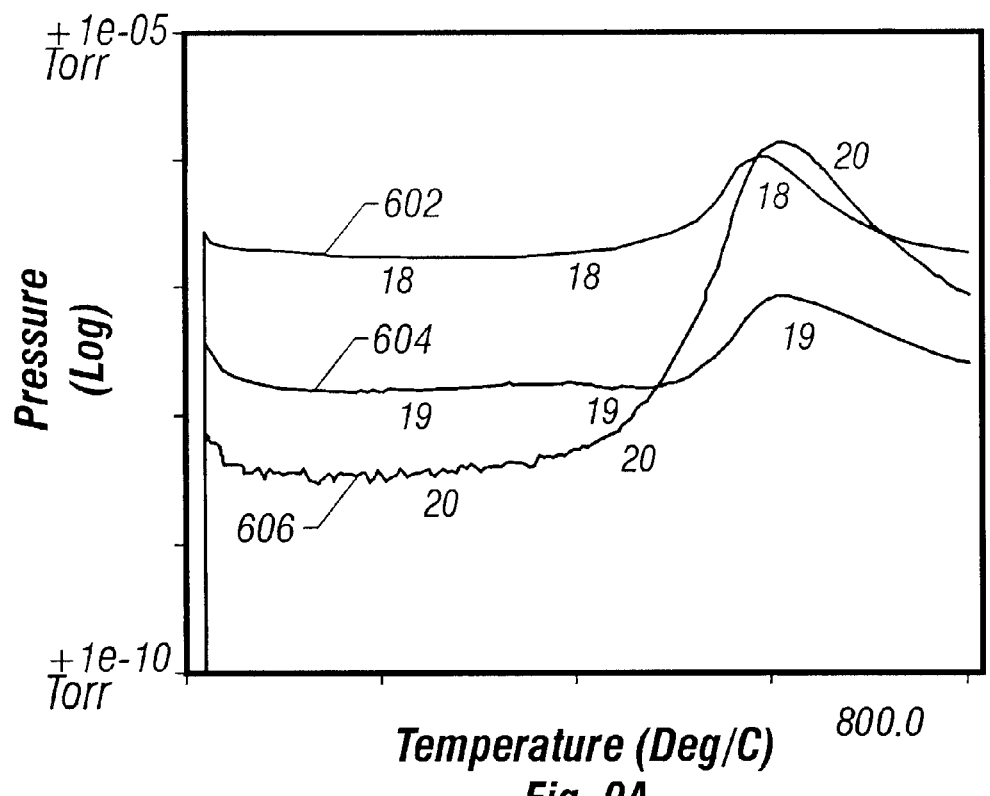
FIGS. 9A and 9B show outgassing test results of FSG films deposited employing nonequal-length nozzles in accordance with another embodiment of the present invention.
Figure 9B:
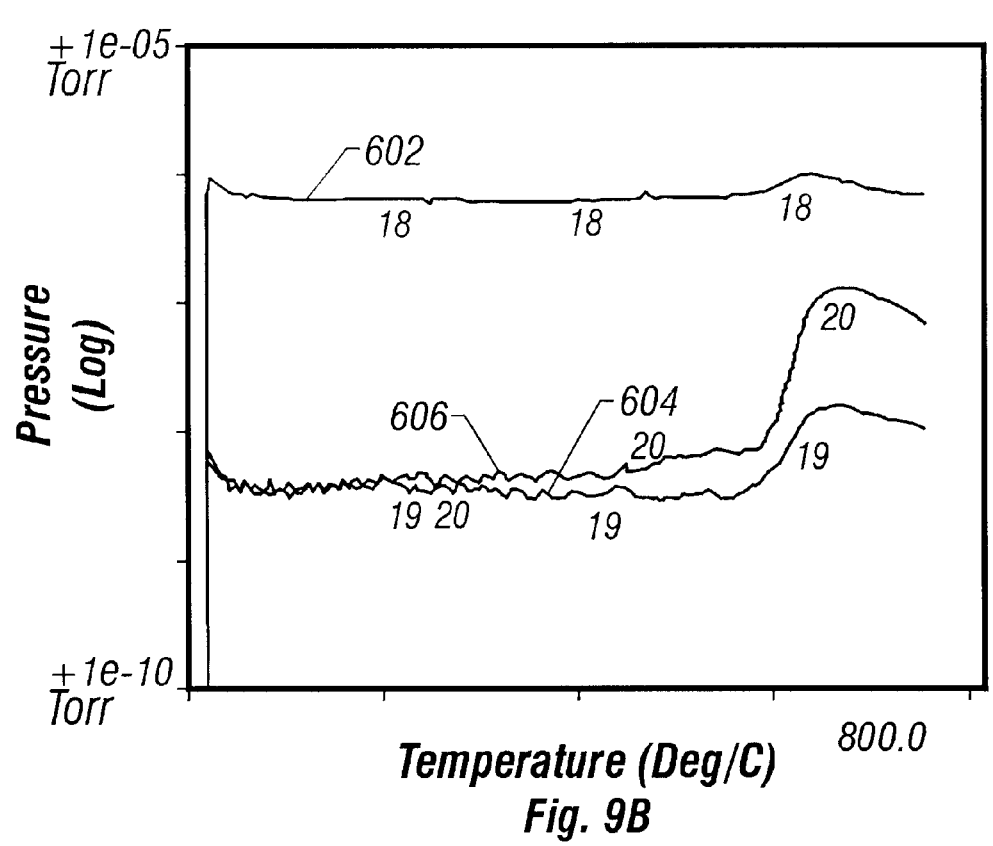

FIGS. 9A and 9B show results for outgassing measurements from films deposited using long nozzles 130f for $SiF_4$ and $O_2$ that were about 1.8 inches from the periphery of the substrate 122 and relatively shorter nozzles 130e for $SiH_4$ that were about 2.00 inches from the periphery of the substrate 122 (see FIG. 2C). The vertical component of the distances is about 1.75 inches. FIG. 9A shows results when a film is deposited using the same process as used for FIG. 7A. FIG. 9B illustrates results when the process is adjusted in an attempt to optimize stability of the film.

FIGS. 9A and 9B are similar to FIGS. 7B and 7C (for equal length nozzles 130c, 130d) in that both yield deposited films with improved stability. Each of traces 602–606 has improved flatness as compared to FIG. 7A, particularly at about 210° C. where peaks were previously observed. Some outgassing still occurs as evident from peaks in the traces 602–606 at about 400–650° C. Improved film stability is also evident from FIG. 9B which shows further improvement in flatness for traces 602–606 representing a reduction in outgassing and an increase in film stability. The results from wet etching of a film deposited using the arrangement of nozzles illustrated in FIG. 2C were similar to those shown in FIG. 8 using the arrangement of nozzles of FIG. 2B, with a linearity that indicates a very nearly ideal film deposition from the bottom of the substrate.

Therefore, it is critical that the injection of the dopant source gas take place at the same distance as or a shorter distance from the periphery of the substrate than the injection of the silicon source gas. It is understood that the above description is intended to be illustrative and not restrictive. By way of example, although the inventions herein have been illustrated primarily with regard to an FSG process, they are not so limited. For instance, a stable doped dielectric film is formed by injecting a first process gas containing precursor of a dielectric material at a first distance and injecting a second process gas containing dopant species at a second distance which is substantially equal to or smaller than the first distance from the periphery of the substrate so as to distribute the dopant species substantially uniformly over the substrate surface. The doped dielectric film may be a doped silicate glass film such as a phosphosilicate glass layer (where the dopant species are from $PH_3$, $(CH_3O)_3P$, premixed $PH_3$ and $SiH_4$, etc.), a borosilicate glass layer (wherein the dopant species are from $BF_3$, $B_2H_6$, $(CH_3O)_3B$, etc.), and a boron phosphorus silicate glass. Examples of other dopant-containing gases include $GeH_4$ and $CH_4$. The doped dielectric film may be a gallium film such GaAs and GaP where the gallium-containing gas such as $GaH_3$ is injected at a first distance from the periphery of the substrate and a dopant-containing gas such as $AsH_3$ and $PH_3$ is injected at a second distance which is substantially equal to or smaller than the first distance.

Of course, the present invention is not limited to using nozzles of particular lengths, or of configurations yielding orifice locations spaced similar distances from the substrate. Different applications may be better served by having nozzles of a similar length or of different lengths, or orifice locations that are spaced by an approximately equal distance or by nonequal distances from the periphery of the substrate. The present invention provides flexibility in accommodating and adapting to different applications to improve the stability of the deposited film for different recipes, different substrate sizes, etc.

The present invention provides several advantages. For example, the present invention allows a single housing to accommodate different recipes while improving deposition uniformity. Different films may be deposited consecutively in a single chamber with very little, if any, transition time needed. Different recipes may be implemented quickly and easily. Injection location can be varied quickly and easily to accommodate different film depositions and experimentation. Different injection location configurations may be created or interchanged quickly. This list, of course, is not exhaustive. Other advantages not listed here, both inherent and otherwise, also fall within the scope of this invention.

While the above is a complete description of specific embodiments of the present invention, various modifications, variations, and alternatives may be employed. For example, other recipes, chamber shapes, substrate sizes, nozzle spacings, and relative nozzle spacing from the substrate may be used. A center-chamber source need not be used. Multiple gases need not be delivered via one nozzle. The chamber may contain more than one exhaust port or even an annual exhaust port encompassing a base of the substrate support. Other variations will be apparent to persons of skill in the art. These equivalents and alternatives are included within the scope of the present invention. Therefore, the scope of this invention is not limited to the embodiments described, but is defined by the following claims and their full scope of equivalents.

What is claimed is:

1. A method of forming a doped dielectric layer on a substrate surface in a process chamber, said method comprising the steps of:
   injecting a first process gas containing precursor of a dielectric material into said process chamber at a first distance from a periphery of said substrate surface; and
   injecting a second process gas containing dopant species into said process chamber at a second distance from said periphery of said substrate surface, said second process gas reacting with said first process gas in said process chamber to deposit a doped dielectric layer on said substrate surface,
   wherein said second distance is substantially equal to or smaller than said first distance, and wherein said first process gas and said second process gas are injected in directions that substantially lie on a plane.

2. The method of claim 1 wherein the doped dielectric layer comprises a doped silicate glass layer.

3. The method of claim 2 wherein said doped silicate glass layer comprises a halogen-doped silicate glass layer.

4. The method of claim 3 wherein said halogen-doped silicate glass layer comprises a fluorine-doped silicate glass layer.

5. The method of claim 4 wherein said second process gas is selected from the group consisting of $SiF_4$, $SiH_2F_2$, and $NF_3$.

6. The method of claim 2 wherein said doped silicate glass layer comprises a phosphosilicate glass layer.

7. The method of claim 6 wherein said second process gas is selected from the group consisting of $PH_3$, $(CH_3O)_3P$, and premixed $PH_3$ and $SiH_4$.

8. The method of claim 2 wherein said doped silicate glass layer comprises a borosilicate glass layer.

9. The method of claim 8 wherein said second process gas is selected from the group consisting of $BF_3$, $B_2H_6$, and $(CH_3O)_3B$.

10. The method of claim 1 wherein said first process gas comprises a silicon-containing gas selected from the group consisting of $SiH_4$, $SiCl_4$, $SiCH_6$, and $SiC_3H_{10}$.

11. The method of claim 10 wherein the second process gas is selected from the group consisting of $AsH_3$, $PH_3$, $GeH_4$, and hydrocarbons.

12. The method of claim 1 wherein the first process gas comprises a gallium-containing gas.

13. The method of claim 12 wherein the gallium-containing gas comprises $GaH_3$ and the second process gas is selected from the group consisting of $AsH_3$ and $PH_3$.

14. The method of claim 1 wherein said first process gas is injected at multiple locations spaced around said periphery of said substrate surface at substantially said first distance.

15. The method of claim 14 wherein said multiple locations are substantially evenly spaced around said periphery of said substrate surface.

16. The method of claim 1 wherein said second process gas is injected at multiple locations spaced around said periphery of said substrate surface at substantially said second distance.

17. The method of claim 16 wherein said multiple locations are substantially evenly spaced around said periphery of said substrate surface.

18. The method of claim 1 wherein said first process gas is injected at multiple first locations spaced around said periphery of said substrate surface and said second process gas is injected at multiple second locations interleaved among said multiple first locations.

19. The method of claim 1 wherein said first process gas is injected at multiple first locations and said second process gas is injected at multiple second locations spaced around said periphery of said substrate surface, said multiple second locations being equal to or greater in number than said multiple first locations.

20. The method of claim 1 wherein said first process gas is injected at multiple first locations and said second process gas is injected at multiple second locations spaced around said periphery of said substrate surface, said multiple first locations and multiple second locations being selected to form a film having a desired chemical composition of a substantially uniform distribution on said substrate surface.

21. The method of claim 1 wherein said first distance and said second distance are selected to form a film having a desired chemical composition of a substantially uniform distribution on said substrate surface.

22. The method of claim,1 wherein said first distance ranges from about 1.75 to about 3.5 inches.

23. The method of claim 22 wherein said first distance ranges from about 2.75 to about 3.25 inches.

24. The method of claim 1 wherein said second distance ranges from about 1.75 to about 3.5 inches.

25. The method of claim 24 wherein said second distance ranges from about 1.75 to about 2.25 inches.

26. The method of claim 1 wherein said first process gas and said second process gas are injected in directions substantially parallel to said substrate surface.

27. The method of claim 1 wherein the plane is vertically spaced above the substrate surface by a distance of about 1.5 to about 2.0 inches.

28. A method of forming a doped dielectric layer on a substrate surface in a process chamber, said method comprising:

injecting a first process gas containing precursor of a dielectric material into said process chamber at a first distance from a periphery of said substrate surface; and injecting a second process gas containing fluorine dopant species into said process chamber at a second distance from said periphery of said substrate surface, said second process gas reacting with said first process gas in said process chamber to deposit a dielectric layer containing fluorine on said substrate surface, said second distance being substantially equal to or smaller than said first distance, said first process gas and said second process gas being injected in directions that substantially lie on a plane.

29. The method of claim 28 wherein said second process gas is selected from the group consisting of $SiF_4$ and $SiH_2F_2$.

30. The method of claim 28 wherein said first distance ranges from about 1.75 to about 3.5 inches and said second distance ranges from about 1.75 to about 3.5 inches.

31. The method of claim 30 wherein said first distance ranges from about 2.75 to about 3.25 inches and said second distance ranges from about 1.75 to about 2.25 inches.

32. The method of claim 28 wherein said first process gas and said second process gas are injected in directions substantially parallel to said substrate surface.

33. The method of claim 28 wherein the plane is vertically spaced above the substrate surface by a distance of about 1.5 to about 2.0 inches.

* * * * *